United States Patent
Voutsas

(10) Patent No.: US 6,383,899 B1
(45) Date of Patent: *May 7, 2002

(54) METHOD OF FORMING POLYCRYSTALLINE SEMICONDUCTOR FILM FROM AMORPHOUS DEPOSIT BY MODULATING CRYSTALLIZATION WITH A COMBINATION OF PRE-ANNEALING AND ION IMPLANTATION

(75) Inventor: Tolis Voutsas, Vancouver, WA (US)

(73) Assignee: Sharp Laboratories of America, Inc., Camas, WA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/653,258

(22) Filed: May 24, 1996

Related U.S. Application Data

(60) Provisional application No. 60/014,899, filed on Apr. 5, 1996.

(51) Int. Cl.[7] .......................... H01L 21/20; H01L 21/36
(52) U.S. Cl. ....................................... 438/486; 438/488
(58) Field of Search .................................. 438/166, 486, 438/487, 488, 491, 528, 532, DIG. 918, FOR 184, FOR 158, FOR 201, FOR 206, FOR 393, FOR 470, FOR 484, FOR 491, FOR 478

(56) References Cited

U.S. PATENT DOCUMENTS 3,857,013 A 12/1974 Niesse
3,900,345 A * 8/1975 Lesk (List continued on next page.)

FOREIGN PATENT DOCUMENTS

JP 57-159013 * 10/1982 ........ 438/FOR 158
JP 59-155121 * 9/1984 ........ 438/FOR 158

(List continued on next page.)

OTHER PUBLICATIONS

P. Kwizera et al., Appl. Phys. Lett. 41(4) (1982) 379 "SPE . . . polysilicon films amorphized by Si ion implantation", Aug. 1982.*

(List continued on next page.)

*Primary Examiner*—Keith Christianson
*Assistant Examiner*—Evan Pert
(74) *Attorney, Agent, or Firm*—Kolisch Hartwell Dickinson McCormack & Heuser

(57) ABSTRACT

A solid-phase crystallization process for producing a semiconductor film of polycrystalline material such as silicon from a film containing the material in an amorphous state includes depositing on a substrate a substantially amorphous film of the material. Next, the amorphous material is partially crystallized to form in the film microcrystallite material particles adjacent noncrystallized regions. The process also includes implanting in the film ions of a preselected type, and at a preselected energy, dose and species, selectively to eliminate preselected ones of the microcrystallite material particles, and further to amorphize the noncrystallized regions. Ultimately, an annealing of the film is performed to at least substantially form polycrystalline material. The material is preferably silicon, and the ion-implanting step preferably involves silicon or germanium ions, in a preselected dose for silicon of $1 \times 10^{16}$ cm$^{-2}$ at an energy of less than about 100 keV, and in a preselected dose for germanium of $1 \times 10^{15}$ cm$^{-2}$ at an energy of less than about 200 keV. An inducing substep is also performed as part of the partially crystallizing step, causing formation of microcrystallite silicon particles by heating the film for a preselected induction period. A method of preparing a thin-film-transistor film of polycrystalline material from a film containing the material in an amorphous state includes the above steps.

7 Claims, 3 Drawing Sheets

U.S. PATENT DOCUMENTS

| | | | |
|---|---|---|---|
| 4,154,873 A | | 5/1979 | Hickox et al. |
| 4,472,873 A | | 9/1984 | Ko |
| 4,476,150 A | | 10/1984 | Rose |
| 4,904,611 A | * | 2/1990 | Chiang ................. 438/486 |
| 4,991,939 A | | 2/1991 | Momose et al. |
| 5,054,887 A | | 10/1991 | Kato et al. |
| 5,254,484 A | * | 10/1993 | Hefner et al. ............ 438/528 |
| 5,290,712 A | * | 3/1994 | Sato et al. ............... 438/486 |
| 5,306,657 A | | 4/1994 | Yang |
| 5,318,661 A | * | 6/1994 | Kumomi |
| 5,391,508 A | | 2/1995 | Matsuoka et al. |
| 5,395,804 A | | 3/1995 | Ueda |
| 5,403,756 A | | 4/1995 | Yoshinouchi et al. |
| 5,457,058 A | * | 10/1995 | Yonehara ................ 438/166 |
| 5,495,824 A | * | 3/1996 | Yonehara et al. ........ 438/486 |
| 5,627,086 A | * | 5/1997 | Noguchi ................. 438/486 |

FOREIGN PATENT DOCUMENTS

| | | | | |
|---|---|---|---|---|
| JP | 61-116821 | * | 6/1986 | |
| JP | 62-137819 | * | 6/1987 | ........ 438/FOR 158 |
| JP | 63-137412 | * | 6/1988 | ........ 438/FOR 158 |
| JP | 3-250728 | * | 11/1991 | |
| JP | 3-280434 | * | 12/1991 | |
| JP | 5-47660 | * | 2/1993 | |
| JP | 56-33821 | * | 4/1998 | ........ 438/FOR 158 |

OTHER PUBLICATIONS

"Seed selection through ion channeling to modify crystallographic orientations of polycrystalline Si films on SiO2: Implant angle dependence," K.T–Y. Kung et al., Appl. Phys. Lett. 46 (7), Apr. 1, 1985, pp. 683–685.

"Grain growth and size distribution in ion–irradiated chemical vapor deposited amorphous silicon," C. Spinella et al., Appl. Phys. Lett. 55 (2), Jul. 10, 1989, pp. 109–111.

"Crystallization of amorphous Si on glass substrate through nucleation by Si+ ion implantation," Tomonori Yamaoka et al., Appl. Phys. Lett 57 (19), Nov. 5, 1990, pp. 1970–1972.

"Suppression of nucleation during crystallization of amorphous thin Si films," James S. Im et al., Appl Phys. Lett. 59 (18), Oct. 28, 1991, pp. 2314–2316.

"Grain–size distribution in ion–irradiated amorphous Si films on glass substrates," Keiji Oyoshi et al., J. appl. Phys. 71 (2), Jan. 15, 1992, pp. 648–652.

* cited by examiner

Fig. 7

| PRE-ANNEAL TIME (HR) | IMPLANT SPECIES | IMPLANT ENERGY (KeV) | IMPLANT DOSE (cm$^{-2}$) | DR(*) (%) | POST-ANNEAL TIME (HR) | TOTAL TIME (HR) | GRAIN SIZE (mm) |
|---|---|---|---|---|---|---|---|
| 15 | Ge | 160 | 1E14 | -28.9 | 8 | 23 | 0.65 |
| 15 | Ge | 100 | 1E14 | -26.2 | 8 | 23 | 0.63 |
| 15 | Ge | 100 | 1E13 | 290.6 | 3 | 18 | 0.70 |
| 15 | Si | 90 | 5E14 | 103.7 | 8 | 23 | 0.76 |
| 15 | Si | 40 | 5E14 | -71.9 | 8 | 23 | 1.10 |
| 12 | Ge | 100 | 1E14 | 797.7 | 3 | 15 | 0.85 |
| 12 | Si | 90 | 5E15 | -100.0 | 11 | 23 | 0.90 |
| 12 | Si | 90 | 5E14 | 59.1 | 8 | 20 | 0.85 |
| 12 | Si | 40 | 5E14 | -77.3 | 11 | 23 | 0.98 |
| — | — | — | — | — | 36 | 36 | 0.60 |

METHOD OF FORMING POLYCRYSTALLINE SEMICONDUCTOR FILM FROM AMORPHOUS DEPOSIT BY MODULATING CRYSTALLIZATION WITH A COMBINATION OF PRE-ANNEALING AND ION IMPLANTATION

CROSS REFERENCE TO RELATED APPLICATION

This application claims priority from U.S. provisional patent application Serial No. 60/014,899 filed Apr. 5, 1996.

TECHNICAL FIELD

The invention relates generally to processes for forming polycrystalline semiconductor matter or material such as silicon. More particularly, the invention concerns preparation of low-temperature polysilicon films usable as thin film transistors (ITFs) for active matrix liquid crystal displays.

BACKGROUND

Solid phase crystallization (SPC) of amorphous silicon (a-Si) films typically requires relatively high temperatures and relatively long crystallization times. The grain size of SPC films is typically in the range of about 0.3–0.5 $\mu$m.

It is desirable to enlarge the grain size in such films, and several proposals have been made that involve ion-implantation. However, such conventional approaches have been unsatisfactory because they result in impractical, commercially unacceptably long crystallization times.

It is also desirable to increase the speed of crystallization upon annealing of the film. Conventional approaches to accomplish such increased speed propose including in the overall crystallization process, the formation of so-called seeds in the as-deposited film. However, such approaches require relatively low deposition rates, in the range of about <20 Å/minute, for the as-deposited a-Si film which limits throughput to commercially unacceptable levels.

Until now, no semiconductor crystallization process has been proposed that combines relatively fast crystallization at low temperatures with resulting, relatively large grain size for crystallized silicon particles in the polysilicon film. Desired, relatively fast crystallization is in the range of <36 hours (and preferably <20 hours) at 600° C. for a 1,000 Å silicon film.

Accordingly, it is a principal object of the present invention to overcome the drawbacks and/or ineffectiveness of conventional processes.

Yet another object is to provide a process of forming polysilicon films that includes a crystallization-completing annealing step with a shorter durational requirement than conventional processes, and with a temperature requirement of $\leq$600° C.

Another object is to provide such a process that produces polysilicon films with a relatively large grain size of greater than about 0.5 $\mu$m.

Yet another object is to provide such a process that produces polysilicon films having relatively uniform grain-size distribution.

It is also an object of the invention to provide such a process that can be cost-effectively commercially practiced.

SUMMARY OF THE INVENTION

In brief summary, one aspect of the invention includes a solid-phase crystallization process of forming a film of polycrystalline semiconductor matter from a film containing the matter in an amorphous state. The process includes depositing on a substrate a film of substantially amorphous matter, modulating formation of crystals in the amorphous matter, and annealing of the film to at least substantially form modulated polycrystalline matter.

The modulating step preferably includes the substeps of partially crystallizing the amorphous matter to form in the film regions of microcrystllite matter particles adjacent regions of noncrystallized matter particles, and implanting in the film ions of a preselected type, and at a preselected energy, dose and of a preselected species, selectively to eliminate preselected ones of the microcrystallite matter particles, and further to amorphize the non-crystallized regions.

Another aspect of the invention includes a solid-phase crystallization process of forming a film of polycrystalline semiconductor matter from a film containing the matter in an amorphous state, which process includes the steps of depositing on a substrate a film of substantially amorphous matter, beginning formation of crystals in the amorphous matter, interrupting the formation of crystals after a preselected time period, and annealing of the film to at least substantially form polycrystalline matter.

Preferably, the beginning step of the process includes the substep of partially crystallizing the amorphous matter to form in the film regions of microcrystallite matter particles adjacent regions of noncrystallized matter particles, and the process further includes implanting in the film ions of a preselected type, and at a preselected energy, dose and species, selectively to eliminate preselected ones of the microcrystallite matter particles, and further to amorphize the non-crystallized regions.

Yet another aspect of the invention is a crystallization process for producing a film of polycrystalline material from a film containing the material in an amorphous state. The process includes the steps of depositing on a substrate a substantially amorphous film of the material, and partially crystallizing the amorphous material to form in the film microcrystallite material particles adjacent noncrystallized regions. The process also includes implanting in the film ions of a preselected type, and at a preselected energy, dose and species, selectively to eliminate preselected ones of the microcrystallite material particles, and further to amorphize the non-crystallized regions. As used herein, amorphize means to break down crystal structure. Ultimately, an annealing of the film is performed to at least substantially form polycrystalline material.

The ion-implanting step preferably involves silicon or germaninm ions, in a preselected dose, and using an implanting energy of a preselected amount. The preselected dose and energy for silicon is a dose of $1\times10^{16}$ cm$^{-2}$ at an energy of less than about 100 keV, and for germanium is a dose of $1\times10^{15}$ cm$^{-2}$ at an energy of less than about 200 keV. An inducing substep is also performed as part of the partially crystallizing step, causing formation of microcrystallite silicon particles by heating the film for a preselected induction period. The overall process temperature is preferably 600° C. The inducing substep preferably includes heating the film at 600° C. in the range of about 8.5–9.0 hours, and the overall partially crystallizing step includes heating the film at 600° C. in the range of about 12–15 hours. In other words, the partially crystallizing step includes heating the film for about 3.5–6.5 hrs. in addition to the inducing substep which includes heating the film for 8.5–9.0 hrs.

Another feature of the invention is a method of preparing a TFT film of polycrystalline material from a film containing the material in an amorphous state. That preparation method includes the above-described steps. As used herein, TFT film means the active layer of a conventional TFT device such as those TFT devices discussed in U.S. Pat. Nos. 5,391,508, 5,395,804, 5,403,756, 5,054,887 and 4,991,939, each of which patents is incorporated herein by reference.

Another feature of the invention is a low-temperature process for enhanced crystallization of partially annealed PECVD a-Si films by selective annihilation, or substantial destruction, of seeds through ion implantation and subsequent annealing.

BRIEF DESCRIPTION OF THE DRAWINGS

FIG. 7 shows a table that summarizes certain findings in terms of process parameters and crystal properties.

DETAILED DESCRIPTION OF THE DRAWINGS AND BEST MODE FOR CARRYING OUT THE INVENTION

Figure 1:
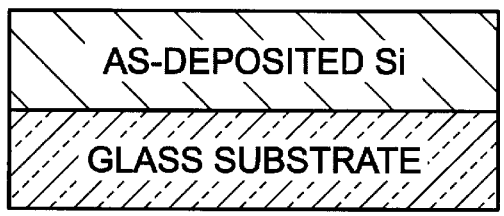
FIG. 1 shows an amorphous PECVD silicon film on glass substrate.
Figure 2:
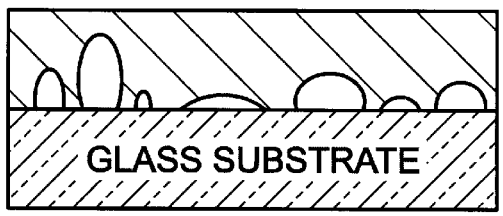
FIG. 2 shows a partially crystallized a-Si film.
Figure 3:
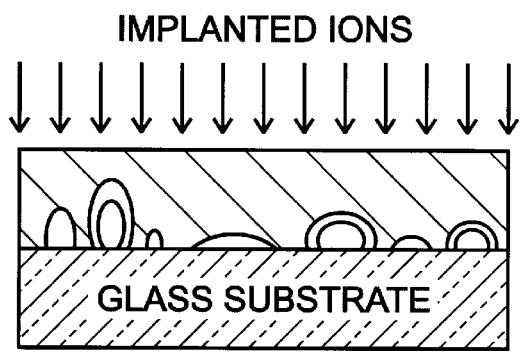
FIG. 3 shows ion implanting the partially crystallized a-Si film.
Figure 4:
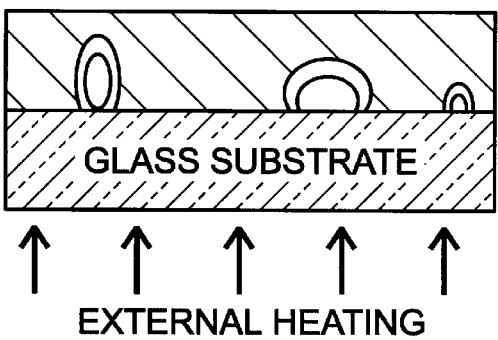
FIG. 4 shows annealing the a-Si film.

Generally, the invention includes the following four steps of a solid-phase crystallization process:

1. depositing, via Plasma-Enhanced Chemical Vapor Deposition (PECVD), an a-Si film on a glass substrate as shown in FIG. 1.
2. partially crystallizing, or pre-annealing, the a-Si in the film to form regions of microcrystallite silicon particles (unlined bubbles) adjacent regions of noncrystallized silicon particles (diagonally hatched), also as shown in FIG. 2.
3. implanting in the film ions of a preselected type, and at a preselected energy, dose and species, selectively to eliminate, or annihilate, preselected ones of the microcrystallite silicon particles (as shown by the difference between the dashed bubbles and the solid-lined bubbles), and further to amorphize the non-crystallized regions (undepicted), all as shown in FIG. 3.
4. annealing the film to at least substantially complete crystallization (as shown by the the difference between the dashed bubbles and the solid-lined bubbles) to form a polysilicon film, also as shown in FIG. 4.

As will be understood after reading the following further description, steps 2–3 above may also be thought of as a single step of modulating formation of crystals in the amorphous matter. While the invention will be described in the context of using silicon as the semiconductor matter or material, it should be understood that any suitable semiconductor matter could be used. In addition, step 2 may also be described as beginning formation of crystals in the amorphous matter, and then interrupting the formation of crystals after a to-be-described, preselected time period.

Each of the above four steps will now be discussed individually in further detail. By combining steps 2–3, certain desired changes in crystal properties and process requirements are achieved, i.e. reduced crystallization time, increased crystal grain size (in the range of about 0.5–0.7 µm, and increased control in the uniformity of crystal grain size.

Process parameters that affect whether the desired changes will be achieved include: 1.) pre-anneal temperature ($\leq 600°$ C.), 2.) pre-anneal time, 3.) implanted species, 4.) implantation energy, 5.) implantation dose, and 6.) anneal temperature (i.e. anneal performed in step 4 after performing pre-anneal in step 2) ($\leq 600°$ C.). The annealing step 4 is also referred to as post-anneal in table 1 below. Referring to the process steps of the invention summarized above and discussed in detail below, parameters (1) and (2) are related to process step 2, parameters (3)–(5) are related to process step 3, and parameter (6) is related to process step 4. For application to flat panel displays, where the substrates are alumina-borosilicate glass, the temperature at any step in the process is restricted to at or below 600° C., with desired temperatures being as low as possible. With respect to pre-treatment of the substrate prior to thin-film deposition, any suitable cleaning material can be used such as commercially available sulfuric acid/peroxide fluids.

For practicing the present invention, the temperature used for both process steps 2 and 4, i.e. the pre-anneal and anneal steps, was 600° C. to keep the crystallization time within a certain, desirable preselected time range. The reason that temperature is at substantially the maximum temperature above which the glass substrate will be damaged is because there are competing goals associated with the method of the invention. That is, the glass substrate must not be damaged (i.e. $\leq 600°$ C.), but the temperature must be high enough to produce commercially effective crystallization rates (i.e. higher temperatures increase such rates). The balance struck for the present invention is preferably in the temperature range of greater than or equal to 550° C. and $\leq 600°$ C. Shifting to the preselected time range for crystallization, and as shown below, that preselected range for the pre-anneal step is 12–15 hours according to the below-identified variables. Generally, the preselected range for the pre-anneal step can be stated as about 30–35% of the anneal time for a control that is crystallized without pre-annealing and ion-implanting as described in steps 2–3 of the present invention. The desired, combined time period for both pre-anneal and anneal (steps 2 and 4) is <36 hours, and preferably less than about 24 hours.

With respect to preferred apparatus used to perform the above steps, any suitable commercially available apparatus will achieve the described results. Examples of such apparatus are described in the U.S. patents incorporated by reference above.

Step 1—Deposition of a-Si Film on Substrate

The preferred deposition method is by Plasma-Enhanced Chemical Vapor Deposition (PECVD) from silane ($SiH_4$) gas at 350° C. The preferred substrate is aluminaborosilicate glass because that is the substrate presently most effective for application to flat panel displays as discussed above. For application to flat panel display devices, the temperature at any step in the fabrication process of such devices is restricted to $\leq 600°$ C. Optimization of the process is enhanced by as low a below –600° C. temperature as possible. The preferred temperature specification in the process of the present invention is to fix the temperature of both the pre-anneal and anneal steps at 600° C., to keep the crystallization time within the desired time of less than 36 hours, and preferably less than about 24 hours.

Alternative deposition methods include: (1) PECVD using either disilane ($Si_2H_6$) gas or a mixture of silane and SiF$_4$ gases; (2) Low Pressure Chemical Vapor Deposition (LPCVD) using either silane, disilane or higher silanes, either in a substantially pure form or diluted in nitrogen, hydrogen, helium or argon gases; (3) Rapid Thermal Chemical Vapor Deposition (RTCVD) using silane in a substantially pure form or diluted in nitrogen, hydrogen, helium or argon gases; or (4) High Density Plasma Deposition (HDPD) using silane or disilane with either ECR or a helicon resonator as a source of high density plasma.

Step 2—Partially Crystallizing/Pre-annealing

To achieve partial crystallization, the as-deposited a-Si film is placed in a 600° C. quartz diffusion furnace for a preselected, to-be-identified duration in an environment of flowing nitrogen gas. The flow rate for the nitrogen gas can be the usual rates used with such a furnace. Alternative heating methods may include: (1) using a diffusion furnace under vacuum; (2) rapid thermal anneal for short duration at high temperature (about 1–2 minutes at 700° C.); (3) laser anneal at low power (e.g. 200–250 mj/cm$^2$); and (4) implantation at high energy, high dose (e.g. 250 keV and $1 \times 10^{16}$ cm$^{-2}$).

Figure 5:
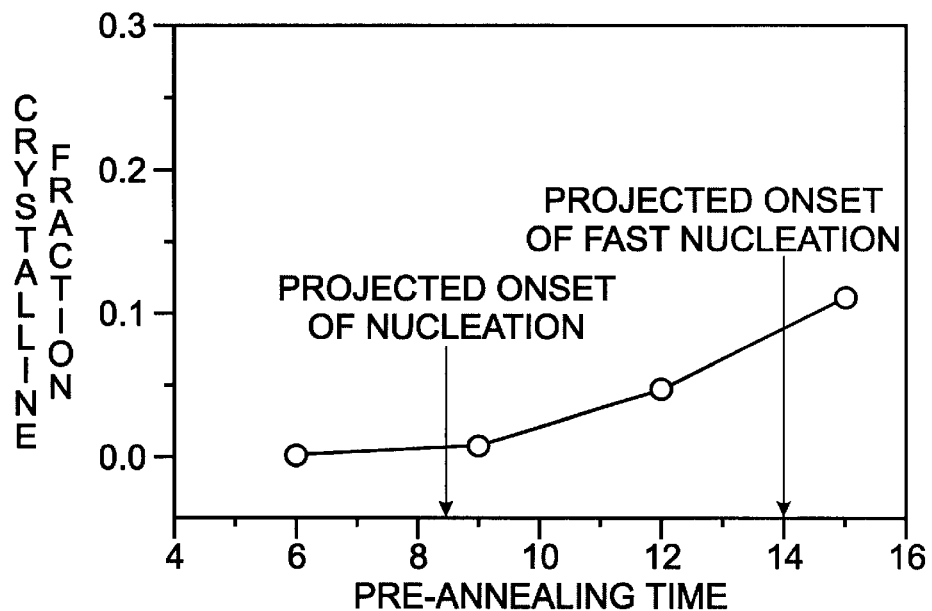
FIG. 5 shows the crystalline fraction of pre-implanted a-Si films as a function of pre-annealing.

The pre-anneal duration, or time, was selected with the aid of the information shown in FIG. 5. The data in that figure were generated to illustrate the effect of the pre-anneal time on the structure of the pre-annealed film. For an as-deposited a-Si film, the crystalline fraction is nominally zero. As the film is progressively heated the crystalline fraction increases, since the film undergoes a phase transformation. However, as shown in FIG. 5, there is not a linear relationship between film heating and formation of crystalline fraction of film. This implies that, unless the film is heated for a duration that exceeds a certain induction period, desired microcrystalline growth will not occur. In practicing the invention, it was found that for the particular as-deposited a-Si films described below, a preferred induction substep is performed for a period of about 8.5–9.0 hrs. at 600° C., with the pre-anneal step, including the inducing substep, occuring for a duration in the range of about 12–15 hrs.

Step 3—Ion Implanting

Administering or implanting ions in the film achieves selective elimination or annihilation of microcrystallite silicon particles and further amorphizes adjacent non-crystalline regions in the film. Such regions may also be thought of as surrounding amorphous regimes. The preferred ion species is either silicon (Si) or germanium (Ge), at preselected energies and doses as shown in the table below. Addition of Si or Ge in a Si-film does not adversely affect the electronic properties of the film. In contrast, addition of other metal elements, such as tin, aluminum or nickel, may accomplish the same effect but may also produce undesirable side effects in the electronic performance of the film (i.e. produce a high leakage current).

Another way to describe the ion-implanting step of the present invention is a crystal-elimination step because that is what the ion implanting step does in step 3 when it further amorphizes the silicon in the thin film that has not formed microcrystallite particles. Other methods of performing crystal elimination may include irradiation or beam irradiation.

Figure 6:
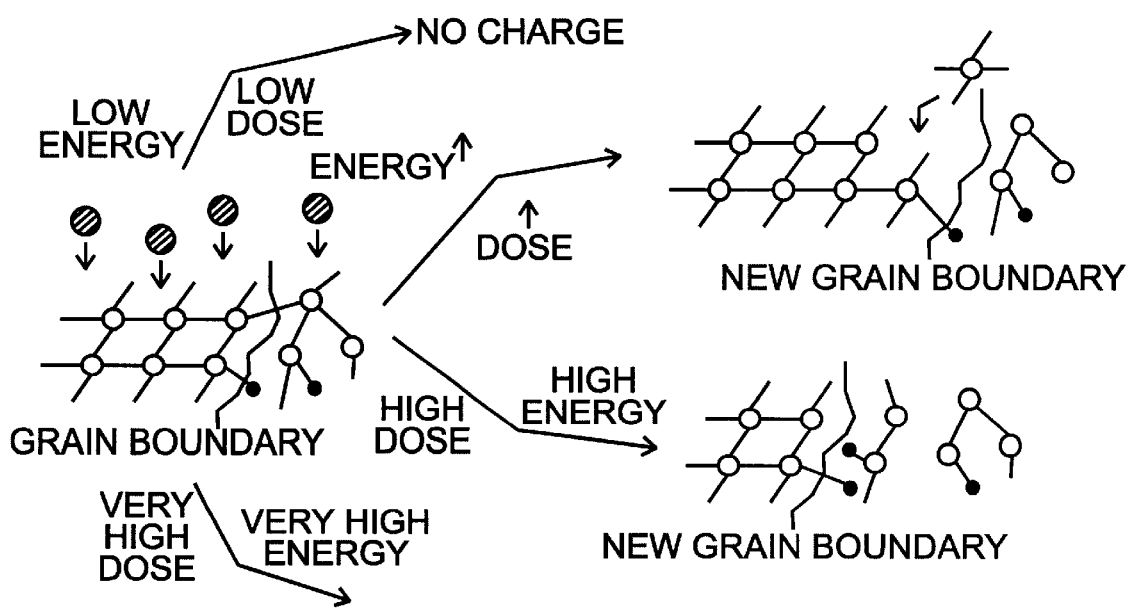
FIG. 6 shows a schematic representation of certain effects of crystallinity pertinent to the invention.

Using conventional simulation techniques, such as commercially available ones like IBM Corporations TRIM™ simulation software, the implantation energy was selected to position the peak of the implantation-induced vacancies at either the center of a 100-nm film or at the interface between such a film and the underlying glass substrate. The dose of the implanted species was selected according to the theory schematically presented in FIG. 6. At low dose, substantially no change occurs in the crystallinity of the partially crystallized film. However, from a qualitative perspective, as the dose increases, crystallinity changes will occur. The implanted ions acquire the ability to break weak bonds by acquiring energy via the external application of energy from an energy source. The implanted ions can then break weak bonds, such as those connecting Si atoms in the amorphous phase, but the implanted ions are incapable of breaking strong bonds, such as those connecting Si atoms in the microcrystalline clusters of microcrystallite particles formed in the partially crystallizing step (step 2) discussed above. As a result, the loose Si atoms may migrate and attach themselves to growing microcrystalline clusters, or even form new grains.

In both low-dose and increasing-dose cases, the crystalline fraction of the post-implanted film will increase. At increasing doses, breakage of strong bonds will eventually start and then will dominate, causing a decrease in the crystalline fraction of the post-implanted film below that of the pre-implanted film. The doses for the invention were chosen based on these general theoretical expectations as a way of using the above-described effects on crystallinity.

FIG. 7 shows a table that summarizes certain findings in terms of process parameters and crystal properties. In FIG. 7, $Dr = 100 \times (r - r_o)/r_o$ and expresses the change in crystalline fraction from before and after the ion-implantation step. ($r_o$) is the crystalline fraction before implantation and (r) is the crystalline fraction after implantation. Positive (+) values of Dr represent an increase in the crystalline fraction (as a result of the implantation), while negative (−) values represent a decrease in the crystalline fraction.

Referring to FIG. 7, it can now be understood that by selecting appropriate values for the process parameters, certain changes can be achieved in crystal properties, such as grain size, and process requirements, such as reduced crystallization time. The desired increase in grain size and reduction in crystallization time can be seen in FIG. 7 by comparing the characteristics of implanted films with the characteristics of the control (unimplanted) sample that is shown in the last line of FIG. 7.

Alternative types of implanting may include using metals such as tin, aluminum or nickel, but, as noted above, these metals are likely to cause undesirable side effects in the electronic performance of the film (i.e. produce a high leakage current).

Step 4—Annealing

The preferred annealing temperature is in the range of about 550–600° C. in a quartz diffusion furnace until substantially complete crystallization occurs.

Alternative annealing methods include using: (1) rapid thermal anneal, (2) laser anneal, or (3) plasma-assisted anneal (using a high density/high frequency plasma such as ECR).

INDUSTRIAL APPLICATION

The process of the present invention is applicable in any situation where it is desired to prepare low temperature polysilicon films. It is particularly applicable to preparation of low temperature polysilicon films for polycrystalline silicon TFTs for active matrix liquid crystal displays.

I claim:

1. A solid-phase crystallization process of forming a TFT semiconductor film of polycrystalline semiconductor matter from a film containing the matter in an amorphous state, comprising:

choosing silicon as the amorphous matter;

depositing on a substrate by plasma-enhanced chemical vapor deposition a single film of substantially amorphous matter so that there is an interface between the film and the substrate;

modulating formation of crystals in the amorphous matter, wherein the modulating includes the substeps of first partially crystallizing the amorphous matter to form in the film at the interface regions of microcrystallite matter particles adjacent regions of noncrystallized matter, and, subsequent to partially crystallizing implanting in the film ions of a preselected type, and at a preselected energy, dose and species to selectively eliminate a fraction of the microcrystallite matter particles, and further to amorphize the non-crystallized regions, wherein the partially crystallizing step includes a substep of inducing to cause formation of microcrystallite silicon particles by heating the film, and wherein the implanting is performed using a dose for silicon of $<1\times10^{16}$ cm$^{-2}$ at an energy of less than about 100 keV, and by using a dose for germanium of $\leq 1\times10^{15}$ cm$^{-2}$ at an energy of less than about 22 keV;

controlling process temperature to be $\leq 600°$ C.; and subsequent to the implanting, annealing of the film to at least substantially form modulated polycrystalline matter usable as a TFT semiconductor film of polycrystalline semiconductor matter.

2. The process of claim 1, wherein the partially crystallizing includes heating the film at 600° C. in the range of about 12–15 hours.

3. A solid-phase crystallization process of forming a TFT semiconductor film of polycrystalline semiconductor matter from a film containing the matter in an amorphous state, comprising:

choosing silicon as the amorphous matter;

depositing on a substrate a single, undoped film of substantially amorphous matter so that there is an interface between the film and the substrate;

beginning formation of crystals in the amorphous matter wherein the beginning includes the substep of partially crystallizing the amorphous matter to form in the film at the interface regions of microcrystallite matter particles adjacent regions of noncrystallized matter, and wherein the process further includes implanting in the film ions of a preselected type, and at a preselected energy, dose and species, to selectively eliminate a fraction of the microcrystallite matter particles, and further to amorphize the non-crystallized regions;

interrupting the formation of crystals after a preselected time period; and subsequent to implanting, annealing of the film to at least substantially form polycrystalline matter usable as a TFT semiconductor film of polycrystalline semiconductor matter.

4. The method of claim 3, wherein the partially crystallizing includes heating the film at 600° C. in the range of about 12–15 hours.

5. A crystallization process for producing a TFT semiconductor film of polycrystalline material from a film containing the material in an amorphous state, comprising:

choosing silicon as the material;

depositing on a substrate by plasma-enhanced chemical vapor deposition a single film of substantially amorphous material so that there is an interface between the film and the substrate;

partially crystallizing the amorphous material to form in the film at the interface regions of microcrystallite material particles adjacent regions of noncrystallized material, wherein the partially crystallizing step includes a substep of inducing to cause formation of microcrystallite silicon particles by heating the film for an induction period of about 8.5–9.0 hours at 600° C.;

implanting in the film ions of a preselected type, and at a preselected energy, dose and of a preselected species, to selectively eliminate a fraction of the microcrystallite material particles, and further to amorphize the non-crystallized regions, wherein the implanting is performed by choosing ions from the group consisting of silicon or germanium, and by using a dose for silicon of $<1\times10^{16}$ cm$^{-2}$ at an energy of less than about 100 keV, and by using a dose for germanium of $\leq 1\times10^{15}$ cm$^{-2}$ at an energy of less than about 200 keV;

controlling process temperature to be $\leq 600°$ C.; and subsequent to implanting annealing of the film to at least substantially form polycrystalline material usable as a TFT semiconductor film of polycrystalline semiconductor matter.

6. The process of claim 5, wherein the partially crystallizing includes heating the film at 600° C. in the range of about 12–15 hours.

7. In the field of thin film transistors (TFTs), a method of preparing a TFT semiconductor film of polycrystalline material from a film containing the material in an amorphous state, comprising:

depositing on a substrate a single, undoped film of substantially amorphous material so that there is an interface between the film and the substrate;

partially crystallizing the amorphous material to form in the film at the interface regions of microcrystallite material particles adjacent regions of noncrystallized material, wherein the partially crystallizing step includes a substep of inducing to cause formation of microcrystallite silicon particles by heating the film for an induction period of about 8.5–9.0 hours of 600° C.;

implanting in the film ions of a preselected type, and at a preselected energy, dose and of a preselected species, to selectively eliminate a fraction of the microcrystallite material particles, and further to amorphize the non-crystallized regions, wherein the implanting is performed by choosing ions from the group consisting of silicon or germanium, and by using a dose for silicon of $1\times10^{16}$ cm$^{-2}$ at an energy of less than about 100 keV, and by using a dose for germanium of $1\times10^{15}$ cm$^{-2}$ at an energy of less than about 200 keV;

controlling process temperature to be less than or equal to 600° C.; and subsequent to implanting annealing of the film to at least substantially form polycrystalline material usable as a TFT semiconductor film of polycrystalline semiconductor matter.

* * * * *